(12) United States Patent
Norell

(10) Patent No.: US 7,728,593 B2
(45) Date of Patent: Jun. 1, 2010

(54) NMR SAMPLE TUBE SIZE ADAPTER

(75) Inventor: Gregory B. Norell, Mays Landing, NJ (US)

(73) Assignee: Norell, Inc., Landisville, NJ (US)

( * ) Notice: Subject to any disclaimer, the term of this patent is extended or adjusted under 35 U.S.C. 154(b) by 265 days.

(21) Appl. No.: 11/855,518

(22) Filed: Sep. 14, 2007

(65) Prior Publication Data

US 2009/0072829 A1 Mar. 19, 2009

(51) Int. Cl.
*G01V 3/00* (2006.01)
(52) U.S. Cl. .......................... 324/321; 324/318
(58) Field of Classification Search ................. 324/321, 324/318
See application file for complete search history.

(56) References Cited

U.S. PATENT DOCUMENTS

| 3,027,799 | A | * | 4/1962 | Weichselbaum ............ 356/246 |
| 4,088,944 | A | * | 5/1978 | Engler et al. ................. 324/321 |
| 5,394,088 | A | | 2/1995 | Cory |
| 5,517,856 | A | * | 5/1996 | Hofmann et al. ............ 324/321 |
| 5,534,780 | A | * | 7/1996 | Lilly ............................ 324/321 |
| 5,977,772 | A | * | 11/1999 | Wand et al. .................. 324/321 |
| 6,812,706 | B2 | * | 11/2004 | Leung et al. ................. 324/321 |
| 7,019,526 | B2 | * | 3/2006 | Lukens et al. ................ 324/321 |

OTHER PUBLICATIONS

Bruker Microbore Tube, http://wilmad-labglass.com/group/2012, Wilmad LabGlass, Vineland, NJ.
PTFE Sleeve Adapter Sets for Coaxial Systems, http://wilmad-labglass.com/group/2016, Wilmad LabGlass, Vineland, NY.
Stem Coaxial Inserts, http://wilmad-labglass.com/group/2093, Wilmad LabGlass, Vineland, NJ.

* cited by examiner

*Primary Examiner*—Louis M Arana
(74) *Attorney, Agent, or Firm*—Diehl Servilla LLC; Glen M. Diehl; Jeffrey I. Blankman

(57) ABSTRACT

An adapter of the invention for fitting an NMR sample tube having an outside diameter into an NMR spectrometer sample tube holder designed for a larger outside diameter sample tube includes a one-piece elongate cylinder having an upper portion and a lower portion. The lower portion has an outside diameter sized to fit within a preselected size NMR spectrometer sample tube holder. The cylinder has a hollow bore axially extending through the upper portion and the lower portion, the hollow bore having a preselected inside diameter sized to accept an NMR sample tube smaller than the preselected size NMR spectrometer sample tube holder.

22 Claims, 8 Drawing Sheets

NMR SAMPLE TUBE SIZE ADAPTER

FIELD OF INVENTION

The present invention is generally related to NMR analytical instrumentation and, more particularly, to sample tubes of several sizes for placement of samples into the NMR instrument sample chamber.

BACKGROUND

Nuclear magnetic resonance (NMR) spectroscopy is a widely used technique in physical and biological science for structural analysis of compounds. Generally, an aliquot of solution in an elongate precision-made sample tube is placed in a sample chamber located between poles of a powerful magnet and subjected to radio frequency exitation. The sample tube is customarily axially rotated to average out the magnetic field and radio frequency exitation.

Sample tubes for the instrument are generally made of glass and are available in a plurality of diameters generally ranging from about 1 mm to about 10 mm in diameter with lengths ranging from about 100 mm to about 8 inches. The most widely used tubes are about 5 mm in diameter and about 7-8 inches long. In use, the tubes are placed in a tube holder that is specifically designed to fit a particular manufacturer's instrument. The tube holder is a precision-made air turbine that spins the sample during the determination of the spectrum.

Since the tubes are elongate and spun during the determination of the spectrum, it is important that the tubes are substantially straight and are substantially coaxial with the tube holder. If the tubes are not substantially straight and coaxial with the tube holder, when the tubes are spun, there will be substantial "run-out" of the bottom portion of the tube that is between the excitation coils and the poles of the magnet. This run-out will degrade the resolution of the spectrum and is very undesirable.

Instrumentation manufacturers supply tube holders to fit specific size tubes. These tube holders, since they are precision-made air turbines, are costly and most users only inventory tube holders for the most commonly used size tubes. In many instances, researchers may only have small amounts of a compound available for testing. In these cases, the standard 5 mm/8 inch tube does not provide a satisfactory vessel for evaluation of these small amounts. As a result, tube manufacturers have developed several sample tubes and adapters to enable use of smaller diameter/low volume samples in standard sample holders.

Examples of these currently available specialized tubes and adapters are illustrated in FIGS. 4 and 5. FIG. 4 illustrates one approach wherein a larger diameter tube upper portion is axially joined to a smaller diameter lower portion that is placed in a standard tube holder so that the smaller diameter lower portion is positioned in the required position between the poles of the magnet. There are several difficulties with this type of tube. Joining the smaller diameter portion to the larger diameter portion requires precision glass blowing, and as a result, tubes of this type are expensive, difficult to clean and fragile.

FIG. 5 illustrates another approach to the problem. In this approach, a smaller diameter inner tube is positioned within a larger diameter outer tube by fitting an upper and lower adapter kit over the inner tube and placing the smaller diameter inner tube having the adapters thereon within the outer tube. While this approach is workable, fitting the adapters over the tube and correctly placing the smaller tube within the outer tube is tricky. It is easy to snap or misalign the small diameter tube during the fitment or removal of the adapter pieces, fitment or removal of the smaller tube from the larger tube and, additionally, these small pieces may easily be lost, subjected to dimensional changes and contamination.

Another approach offered by one instrument manufacturer utilizes a proprietary sample holder and clamping devices for their specific instruments. However, this device is usable only with spectrometers of that manufacturer, and, additionally, is not compatible with standard tubes or tube caps. There are reports from the field of incomplete sealing of tubes in this device because of tubes not being square or being chipped at the top resulting in loss of solvent during the determination of the spectrum.

Accordingly, there is still a need for a more universally applicable and simple to use adapter for allowing the use of smaller diameter tubes in an NMR sample holder designed for larger diameter sample tubes. Such an adapter is disclosed hereinbelow.

SUMMARY

An embodiment of the adapter of the invention for fitting an NMR sample tube having an outside diameter into an NMR spectrometer sample tube holder designed for a larger outside diameter sample tube includes a one-piece elongate cylinder having an upper portion and a lower portion. The lower portion has an outside diameter sized to fit within a preselected size NMR spectrometer sample tube holder. The cylinder has a hollow bore axially extending through the upper portion and the lower portion, the hollow bore having a preselected inside diameter sized to accept an NMR sample tube smaller than the preselected size NMR spectrometer sample tube holder.

The adapter of the invention is simple to use and reuse. It is compatible with standard readily available tube sizes. By being compatible with standard sized tubes, the tubes can utilize standard well-sealing caps. The standard tubes are easily positioned into the adapter and the tube with the adapter is easily placed within the standard tube larger-sized holder for use in the spectrometer while providing the same degree of resolution in a particular instrument as the standard tube with a proprietary appropriately sized sample holder.

DETAILED DESCRIPTION

While this invention is satisfied by embodiments in many different forms, there is herein described in detail, embodiments of the invention with the understanding that the present disclosure is to be considered as exemplary of the principles of the present invention and is not intended to limit the scope of the invention to the embodiments illustrated. The scope of the invention is defined in the claims.

Figure 1:
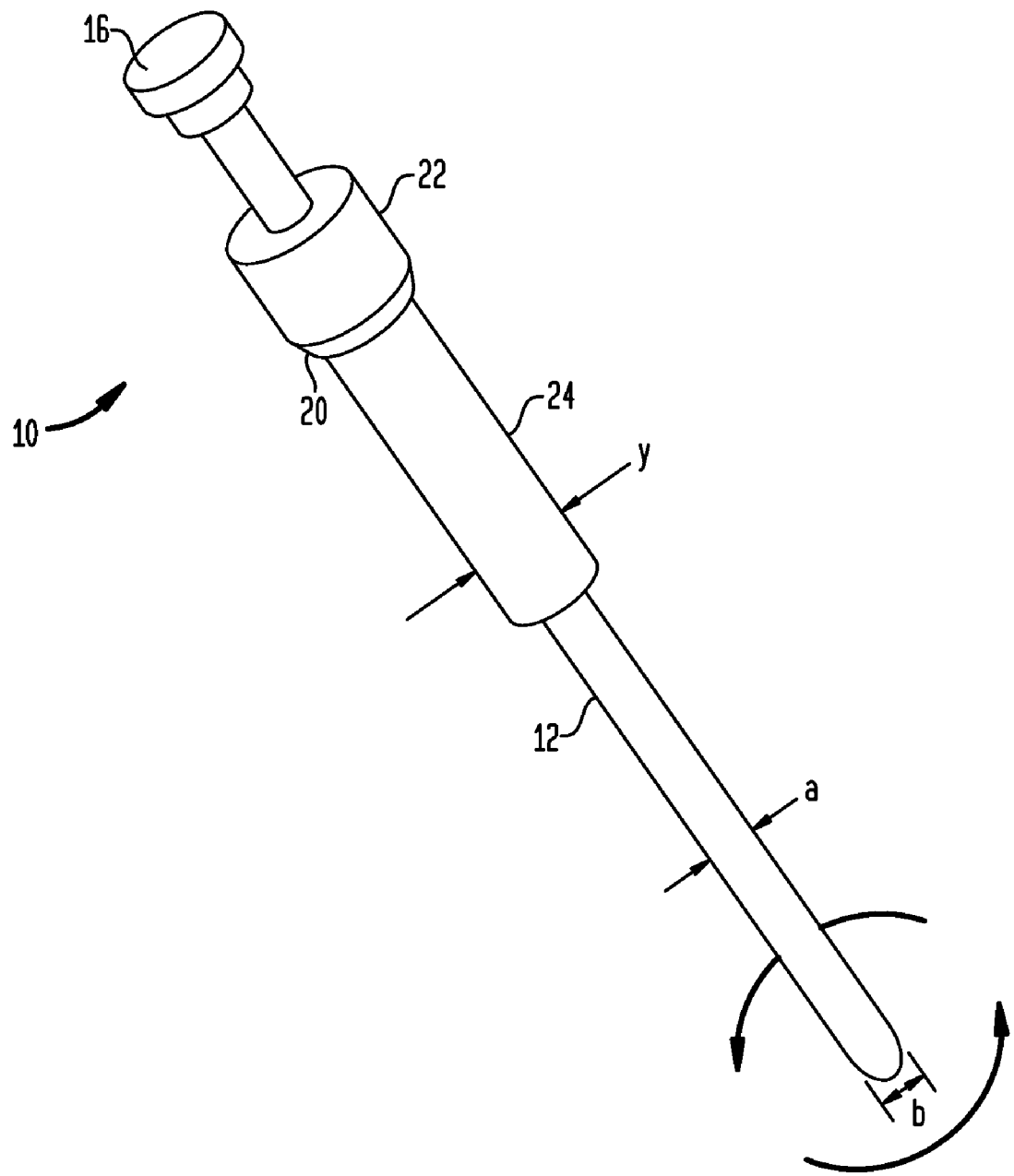
FIG. 1 is a perspective view of an embodiment of the adapter of the invention with an NMR tube disposed therein.
Figure 2:
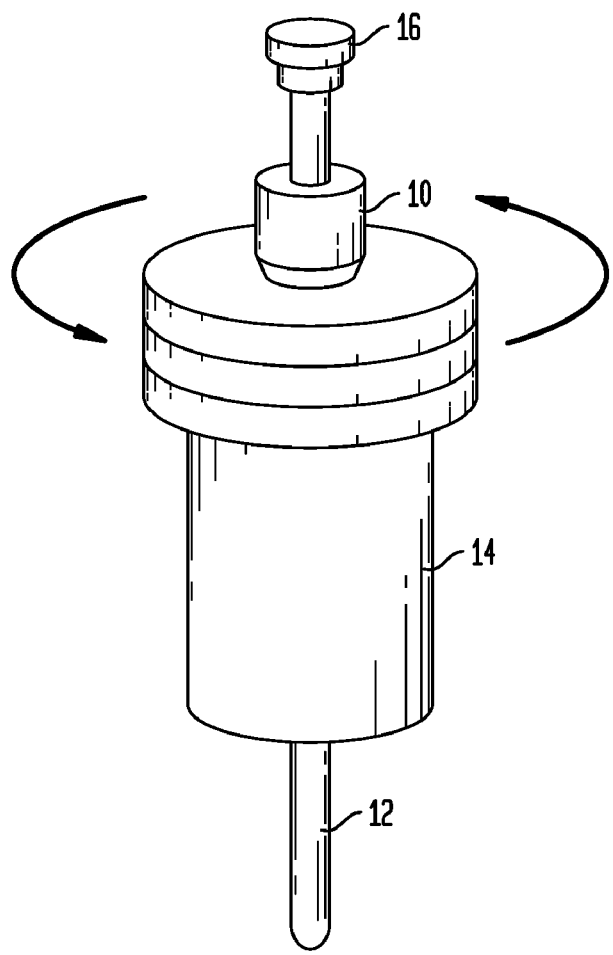
FIG. 2 is a perspective view of the embodiment of FIG. 1, illustrating the adapter placed in a typical NMR sample tube holder.
Figure 3:
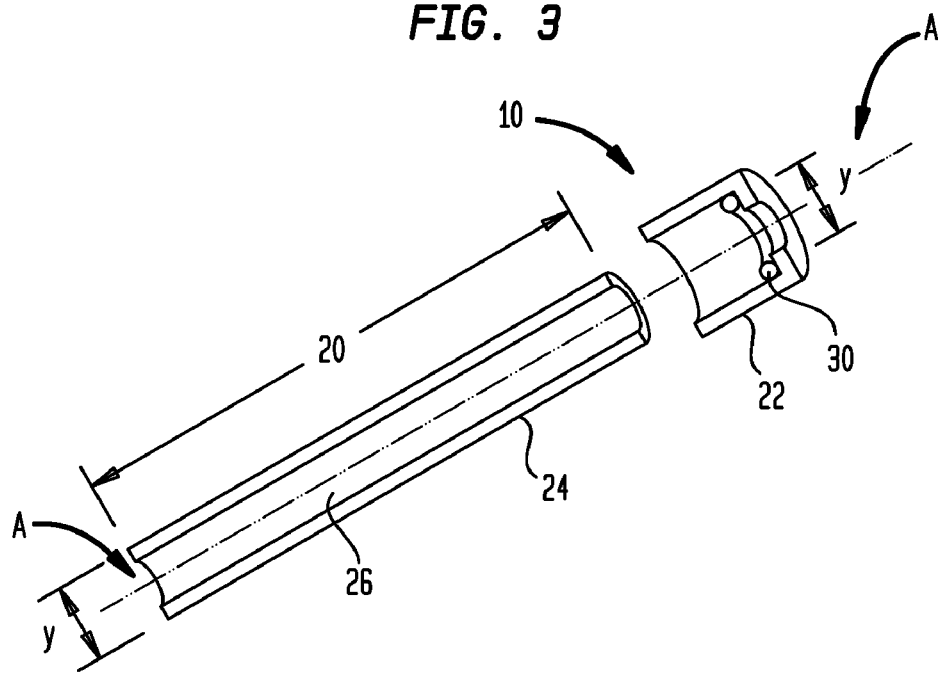
FIG. 3 is an exploded length-wise cross-sectional view of an embodiment of the adapter of the invention.
Figure 4:
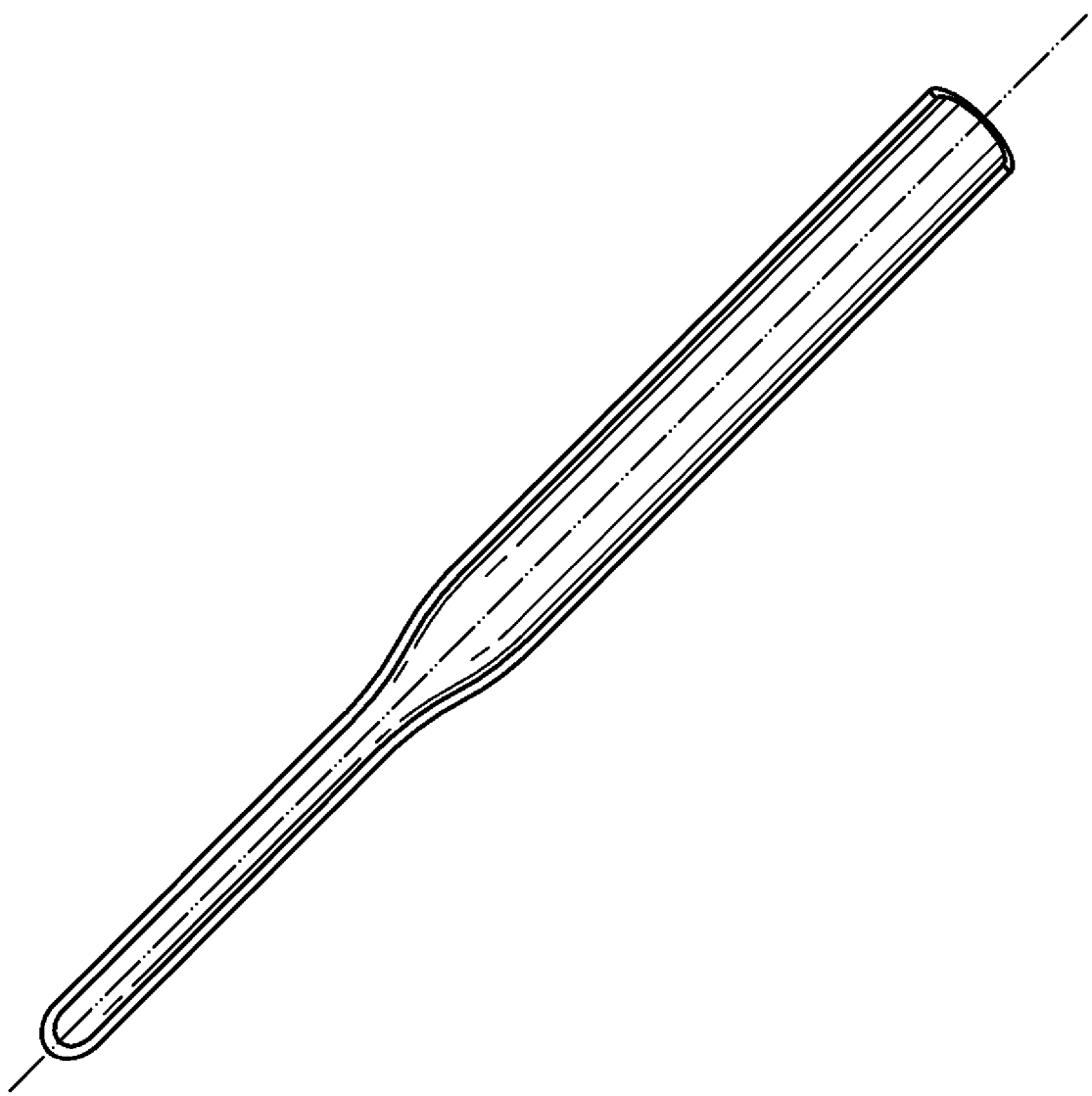
FIG. 4 is a perspective view of a currently available NMR sample tube with a reduced diameter lower section.
Figure 5:
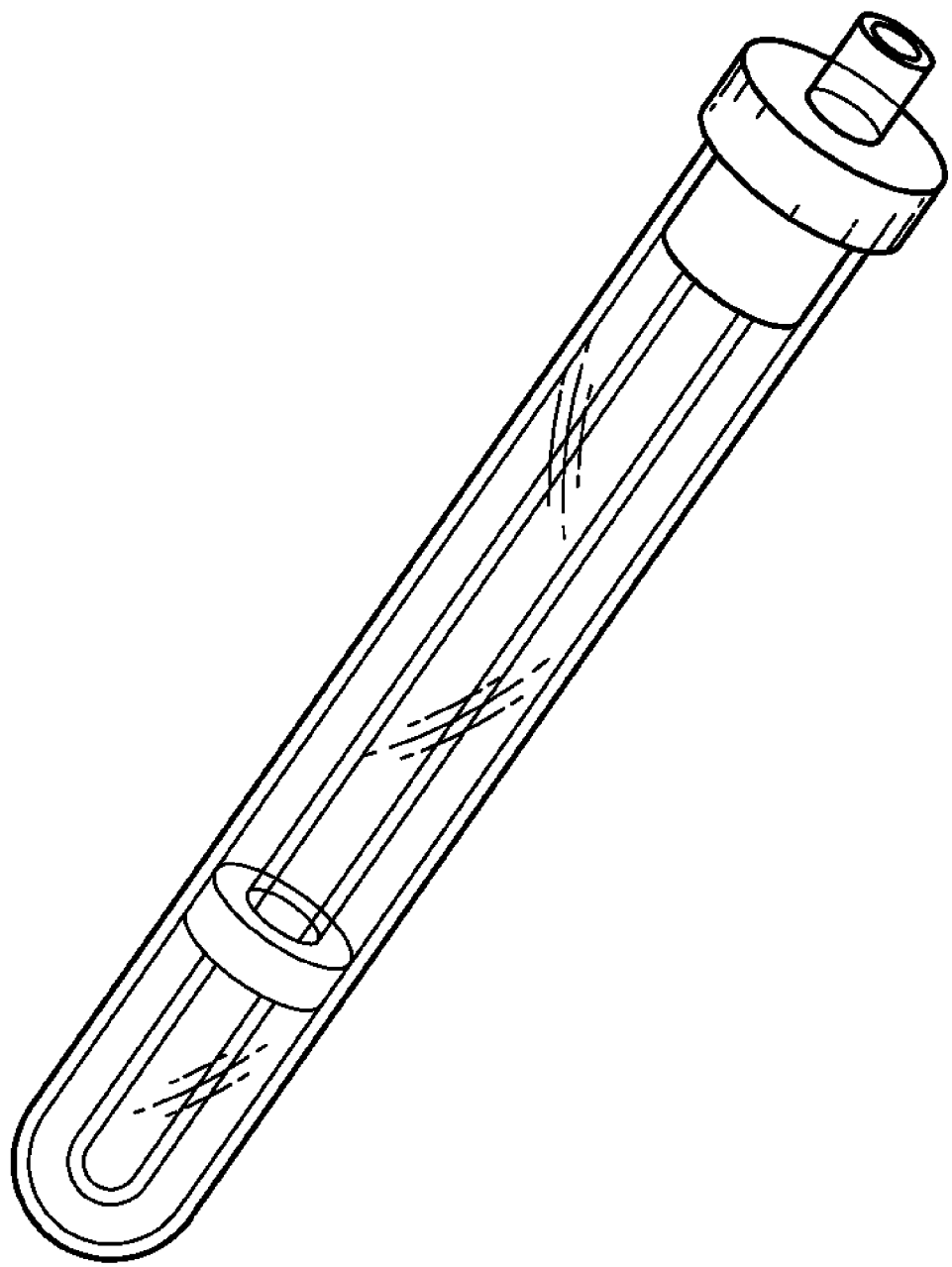
FIG. 5 is a perspective view of a currently available NMR sample tube having spacers holding a smaller diameter tube within a larger diameter tube.

Adverting to FIGS. 1-3, an adapter 10 for fitting an NMR sample tube 12 having an outside diameter "a" into an NMR spectrometer sample tube holder 14 designed for a larger outside diameter sample tube includes a one-piece elongate cylinder 20 having an upper portion 22 and a lower portion 24 with an Axis "A". Lower portion 24 has an outside diameter "y" and a length "x" sized to fit within preselected size NMR spectrometer sample tube holder 14. Cylinder 20 has a hollow bore 26 axially extending through upper portion 22 and lower portion 24. In some embodiments, upper portion 22 determines the depth of placement of adapter 10 into sample tube holder 14. Hollow bore 26 of adapter 10 has a preselected inside diameter sized to accept NMR sample tube 12 smaller than the preselected size NMR spectrometer sample tube holder, e.g., in one embodiment, a 3 mm O.D. tube being adapted to fit in an NMR spectrometer sample tube holder designed to accept a 5 mm O.D. tube. Other non-limiting embodiments include providing adapters 10 sized to fit within sample tube holder 14 sized to receive 10 mm tubes wherein adapter 10 is configured to accept 3, 4, 4.25 or 5 mm O.D. sample tubes. Further non-limiting embodiments include pre-selecting the length of lower portion 24 of adapter 10 to accommodate different manufacturer's proprietary sample holder configurations. Illustrative, but non-limiting examples include providing adapter 10 with a lower portion exposed length of 2.350 in. for "Bruker" produced NMR spectrometers and a lower portion exposed length of 3.603 in. for "Varian" produced NMR spectrometers. Other manufacturers and other models from these manufacturers of instruments as well as similar elongate sample tubes for Electron Spin Resonsance (ESR) spectrometers may have differently dimensioned sample chambers and, accordingly, adapters within the scope of the present claims may be produced with suitable dimensions for these instruments.

When adapter 10 having NMR sample tube 12 placed therein and the adapter 10 is disposed on a machinist's "V-block" and rotated through at least one axial revolution, a Total Indicator Reading (T.I.R.) on a dial indicator at sample tube 12's closed end is 0.002 inches or less. T.I.R. is illustrated in FIG. 1 by the rotational arrows and dimension "b" at the bottom of tube 12. The limitation to the T.I.R. or "run-out" at the end of tube 12 demonstrates that bore 26 of the adapter is substantially co-axial with the outside surface of lower portion 24 of the adapter. If there is excessive run-out of the tube as it spins in the sample chamber of the spectrometer, the quality of the spectrum being determined is degraded. By maintaining the total run-out to less than about 0.002 in., adapter 10 of the invention allows the inherent resolution capabilities of the spectrometer to be realized.

The material selected for forming tube adapter 10 is an important part of enabling the device to maintain dimensional stability. Metallic materials are dimensionally stable and can be machined to tight tolerances, however, because of the use environment, high magnetic fields, most metallic materials are not suitable. Many polymeric materials are available, but selection of polyamide is contraindicated by its potential dimensional change with moisture absorption. Polypropylene and many polyethylenes are softer and difficult to machine to tight tolerances. Polyacetal, available as Delrin™ from DuPont, Wilmington, Del., is suitable for most applications as is polyether ether ketone (P.E.E.K.), albeit a somewhat more expensive material. Polytetrafluoroethylene is also suitable, but is somewhat softer thus harder to precision machine and somewhat less dimensionally stable with temperature change than polyacetal.

A method for using adapter 10 of the invention includes selecting smaller NMR tube 12 with a smaller outside diameter size than the size that the available NMR sample tube holder is sized to receive, e.g., if a 5 mm sample tube holder is available, selecting a 3 mm, 4 mm or a 4.25 mm tube; providing adapter 10 sized for the NMR tube size selected and available sample tube holder 14; placing a sufficient quantity of a material to be analyzed in a suitable solvent into selected tube 12; sealing the tube by applying cap 16; placing the capped selected tube 12 with the sample to be analyzed, as illustrated in FIG. 2, in sample tube holder 14; and placing holder 14 with adapter 10 and sample tube 12 in the spectrometer sample chamber; and determining the spectrum.

Figure 6:
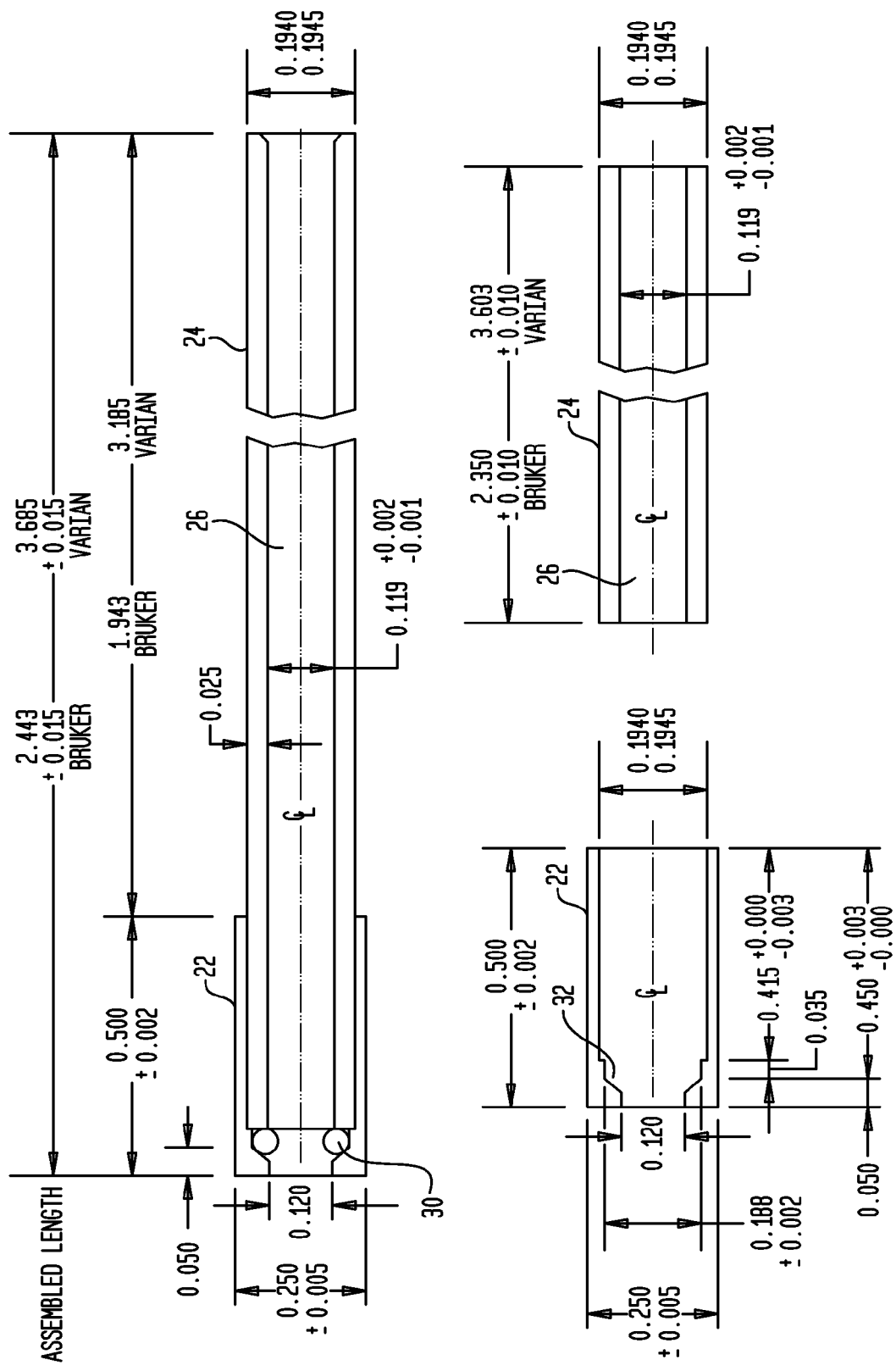
FIG. 6 is a dimensioned cross-sectional view of an embodiment of the adapter of the invention.
Figure 7:
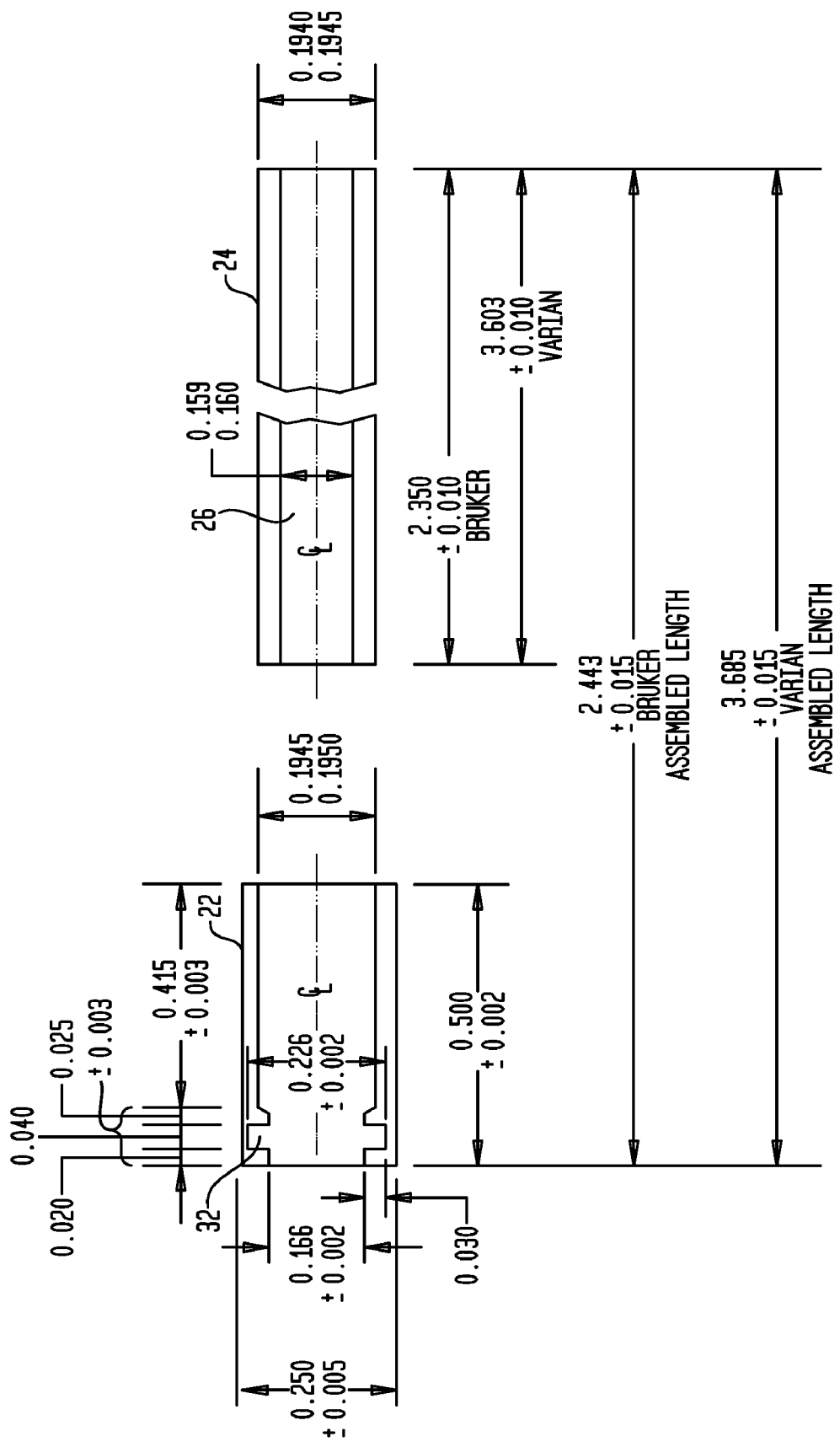
FIG. 7 is a dimensioned cross-sectional view of another embodiment of the adapter of the invention.
Figure 8:
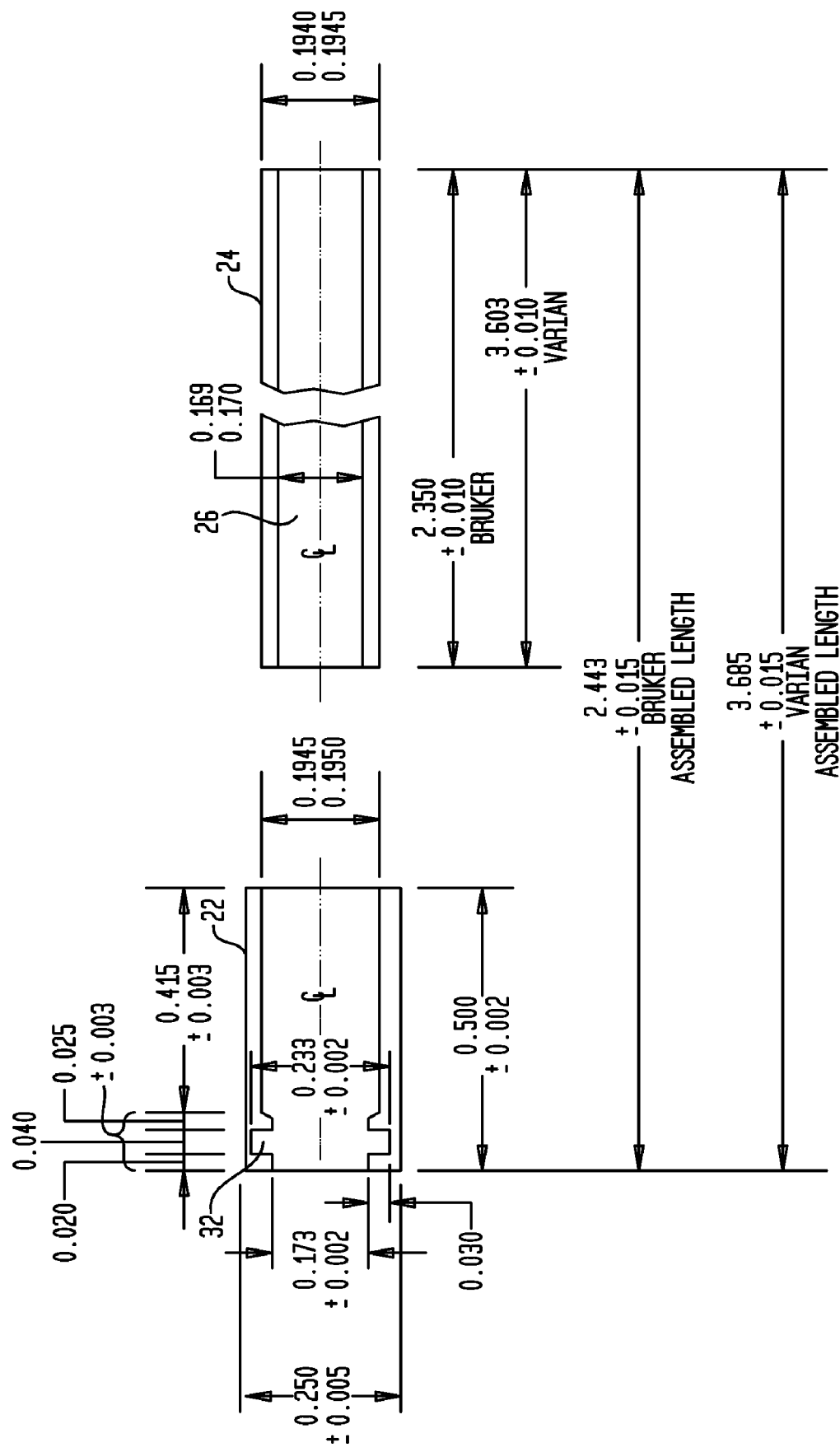
FIG. 8 is a dimensioned cross-sectional view of another embodiment of the adapter of the invention.

Representative, non-limiting, manufacturing drawings for the embodiments described above for adapters of the invention are shown in FIGS. 6, 7 and 8. In these examples, polyacetal was selected as the material for forming the adapters. In a particular non-limiting example of an embodiment, the adapter of the invention is sized to allow use of a standard 3 mm NMR sample tube in a standard Bruker or Varian sample tube holder sized for a standard 5 mm tube. The starting material selected for the lower portion was a polyacetal rod that was centerless ground to a diameter of between about 0.1940 and about 0.1945 inches cut to 2.350 in. length (Bruker) or 3.603 in. length (Varian) with substantially square ends. These lower portion blanks then have a hollow bore coaxially bored therethrough with an inside diameter of about 0.119 in. After boring, one end, selected to be the bottom end of the adapter, is carefully radiused to facilitate insertion of the adapter into the sample tube holder. The top portion of the adapter of the invention is formed from a ¼ in. O.D. polyacetal rod carefully cut to a 0.500 length. A hollow bore is then axially bored through the top portion with an I.D. of about 0.120 to about 0.121 in. A portion of the hollow bore is then coaxially enlarged to 0.1945 in. (diameter "y" in FIG. 3) inner diameter to a depth of about 0.415 inches within the top portion. Both the top portion and the lower portion are then carefully cleaned and degreased. A resilient retaining element 30 is then introduced into the top portion. In one embodiment, a fluorelastomer "O"-ring (Viton 70, available from DuPont, Wilmington, Del. is suitable) with a 3 mm inner diameter and a 1 mm thickness is selected as element 30 and is then coaxially placed into the top portion at the bottom of the 0.1945 bore. The lower portion having a sufficient quantity of a suitable adhesive disposed thereon is coaxially introduced into the 0.1945 bore a sufficient distance to engage and retain the "O"-ring by fixedly attaching the lower portion to the upper portion forming a unitary article of manufacture. One suitable adhesive is a cyanoacrylate (Permabond 910, available from Permabond, Somerset, N.J.). For particular applications, other forms of bonding, including but not limited to ultra-sonic, welding, other forms of adhesive bonding, solvent bonding and spin welding, may be selected.

In other embodiments, as illustrated in FIGS. 7 and 8, it may be desirable to form a groove or recess 32 at the inside of the upper portion to retain resilient retaining element 30. In adapters for other size tubes and other size sample holders, various sizes and lengths of upper and lower portions may be envisioned and selected, as well as different size, thickness and forms of retaining elements. These alternate embodiments for adapter 10 are to be considered within the scope of the present invention as defined in the claims.

As is apparent from the FIGS. 1-2, the top of NMR sample tube 12 is substantially unobstructed when placed in adapter 10, as well as when adapter 10 with sample tube 12 therein, is placed in NMR spectrometer sample holder 14 (best seen in FIG. 2). Since the top of sample tube 12 is unobstructed, most standard NMR sample tube caps 16 may readily be used, thus substantially reducing the possibility of leakage or loss of volatile solvents as reported in some instances with some currently available adapters. In some embodiments of adapter 10, cap 16 may be a specific design for a particular manufacturer. In these embodiments, manufacturer specific cap designs may be used to cooperate with the particular manufacturer's robotic sample handling and placement equipment. In some of these manufacturer specific cases, cap 16 is utilized to regulate the depth of placement of tube 12 in sample holder 14 as well facilitating grasping of tube 12 by the robotic sample handling and placement equipment.

Adapters 10 of the present invention may be offered for sale individually or as a kit for a particular manufacturer's sample holder for a particular size, e.g., a "Bruker" or a "Varian" sample holder intended to receive a 5 mm tube. The kit may include one or more units of adapter 10 sized to receive a 3 mm, 4 mm or 4.25 mm diameter tube. In any of these units of sale, adapters 10 may be placed in a suitable over package (not shown) which serves to protect adapter 10 from damage during handling and storage. Another embodiment of a kit may include one or more tubes of sizes 3 mm, 4 mm or 4.25 mm, along with one or more appropriately sized adapters 10 for a particular manufacturer's instrument.

Figure 9:
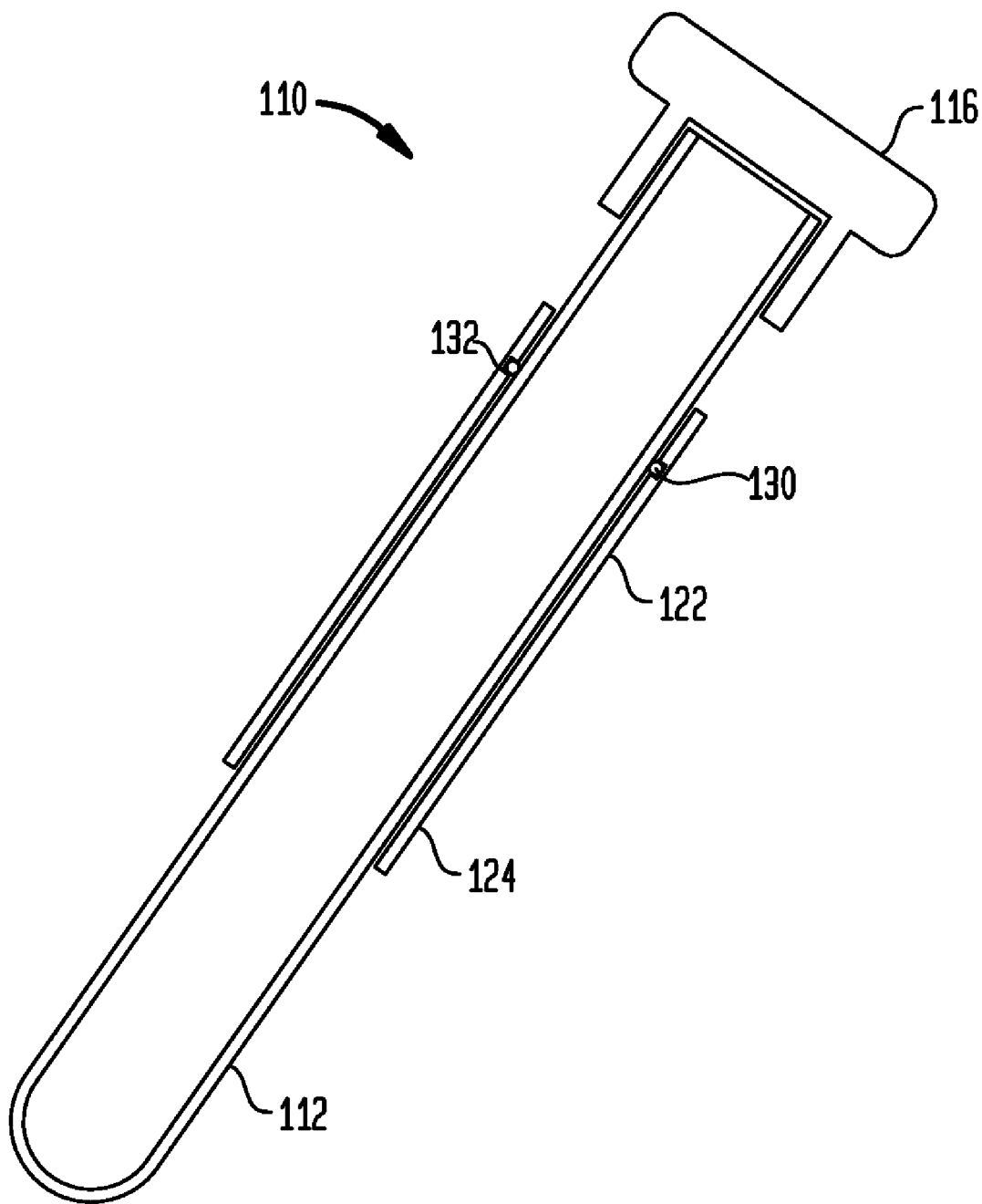
FIG. 9 is a cross-section perspective view of another embodiment of the adapter of the invention.

In a further embodiment, best seen in FIG. 9, adapter 110 of the invention may be configured for compatibility with robotic sample handling systems such as the Varian 768AS and the like. In this embodiment, elements performing functions similar to those in the embodiments of FIGS. 1, 2, 3, 6, 7 and 8 are assigned similar reference characters with the addition of the 100's digit. In this embodiment, lower portion 124 and upper portion 122 have the same outside diameter. Upper portion 122 has a resilient retention element 130 which may be retained in a recess or groove 132. In this use application, the placement depth for tube 112 disposed within adapter 110 in the sample holder of the instrument is determined by cap 116, which is also utilized by the robotic sample handling system to pick and place sample tube 112 in the sample holder or the sample rack. In an exemplary, but not limitative, embodiment for the Varian 768AS, the outside diameter is held between 0.1995 and 0.1960 in. with an inside diameter of about 0.119 in. Other manufacturer's robotic sample handling equipment may have different dimensional requirements and adapters with other specific dimensional requirements are considered within the scope of the present invention. As in the other embodiments of this device, coaxiality of the inside diameter and the outside diameter is an important consideration to allow utilization of the resolution capability of the spectrometer.

What is claimed is:

1. An adapter for fitting an NMR sample tube having an outside diameter into a NMR spectrometer sample tube holder designed for a larger outside diameter sample tube comprises:
    a one-piece elongate cylinder having an upper portion and a lower portion; the lower portion having an outside diameter sized to fit within a preselected size NMR spectrometer sample tube holder; and
    the cylinder having a hollow bore axially extending through the upper portion and the lower portion, the hollow bore having a preselected inside diameter in the upper portion sized to accept an NMR sample tube smaller than the preselected size NMR spectrometer sample tube holder.

2. The adapter of claim 1 wherein when the NMR sample tube is placed within the adapter, a Total Indicator Reading (T.I.R.), when the adapter having the sample tube disposed therein is rotated through at least one complete revolution in a V-block, at sample tube's lower end is 0.002 inches or less.

3. The adapter of claim 1 wherein the upper portion outside diameter is larger than the outside diameter of the lower portion and an inside diameter of the NMR spectrometer sample tube holder so that the depth of placement of the NMR tube in the adapter into the sample chamber of the spectrometer is limited to a preselected depth by contact of the upper portion with the sample tube holder.

4. The adapter of claim 1 wherein the upper portion outside diameter and the lower portion outside diameter are the same and wherein a preselected depth of placement into the sample chamber of the spectrometer is determined by contact with a cap on the NMR tube with the spectrometer sample tube holder.

5. The adapter of claim 1 wherein the length of the lower portion of the adapter is preselected to conform to a particular spectrometer manufacturer's design requirement for NMR sample tube holder and chamber.

6. The adapter of claim 1, wherein when a sample tube of a preselected outside diameter is placed in the adapter, the tube is sealed with a cap selected from the group consisting of a standard NMR sample tube cap sized for the preselected outside diameter of the tube and an NMR tube cap sized for the preselected outside diameter of the tube that is compatible with a particular manufacturer's robotic sample placement apparatus.

7. The adapter of claim 1, wherein the upper portion comprises retention means for retaining the NMR sample tube at a preselected position within the adapter.

8. The adapter of claim 7, wherein the retention means comprises an annular band formed from a resilient material disposed within a channel in the upper portion of the adapter.

9. The adapter of claim 8, wherein the annular band is an "O" ring formed from fluoroelastomeric material having a preselected size based on the preselected NMR sample tube size.

10. The adapter of claim 1, wherein the upper portion of the adapter is fixedly attached to the lower portion by coaxially disposing the lower portion into a cavity formed by an inside diameter of hollow bore in the upper portion sufficient to receive the outside diameter of the lower portion at a preselected position.

11. The adapter of claim 10 wherein the upper portion and the lower portion are fixedly attached by a bonding method selected from the group consisting of ultra-sonic welding, adhesive bonding, solvent bonding and spin welding.

12. The adapter of claim 10, wherein the upper portion and the lower portion are fixedly attached by adhesive bonding.

13. The adapter of claim 1, wherein a material for forming the adapter is selected from the group consisting of high density polyethylene, polytetrafluoroethylene, polyacetal and polyetheretherketone.

14. The adapter of claim 1, wherein an outside diameter of the lower portion is between about 0.1940 and 0.1945 in when measured at any location.

15. The adapter of claim 1, wherein an outside diameter of the lower portion is between about 0.1955 and 0.1960 in.

16. An adapter for fitting an NMR sample tube having an outside diameter into an NMR spectrometer sample tube holder designed for a larger outside diameter sample tube comprising:

a one-piece elongate cylinder formed from polyacetal having an upper portion and a lower portion; the lower portion having an outside diameter that between about 0.1940 and 0.1945 inches measured at any location and being sized to fit within a preselected size NMR spectrometer sample tube holder;

the cylinder having a hollow bore extending through the upper portion and the lower portion, the hollow bore having a preselected inside diameter sized to accept an NMR sample tube smaller than the preselected size NMR spectrometer sample tube holder;

the upper portion of the adapter having an "0"-ring disposed therein for retaining the NMR sample tube at a preselected position within the adapter; and wherein when the NMR sample tube is placed within the adapter, a Total Indicator Reading (T.I.R.), when the lower portion of the adapter having the sample tube disposed therein is rotated through at least one complete revolution in a V-block, at sample tube's lower end is 0.002 inches or less.

17. A method for using an adapter for fitting an NMR sample tube having an outside diameter into an NMR spectrometer sample tube holder designed for a larger outside diameter sample tube comprising:

selecting a smaller NMR tube size than the size an available NMR sample tube holder is sized to receive;

placing a sample in a suitable solvent in the selected tube;

providing an adapter for the NMR tube size selected comprising a one-piece elongate cylinder having an upper portion and a lower portion; the lower portion having an outside diameter sized to fit within a preselected size NMR spectrometer sample tube holder and the cylinder having a hollow bore axially extending through the upper portion and the lower portion, the hollow bore having a preselected inside diameter sized to accept an NMR sample tube smaller than the preselected size NMR spectrometer sample tube holder and the available sample tube holder and placing the selected tube in the adapter;

positioning the adapter having the selected tube with the sample therein in the sample tube holder;

placing the holder with the adapter and sample tube in the spectrometer sample chamber; and determining the spectrum.

18. The method of claim 17 further comprising applying a cap to the tube.

19. The method of claim 18 wherein the cap is a manufacturer specific cap for cooperating with a manufacturer specific robotic sample handling system.

20. A kit for adapting a 5 mm NMR sample tube holder to accept an NMR sample tube having a smaller outside diameter comprising:

at least one adapter for an NMR tube comprising a one-piece elongate cylinder having an upper portion and a lower portion; the lower portion having an outside diameter sized to fit within an NMR spectrometer sample tube holder designed to accept a 5 mm sample tube and the cylinder having a hollow bore axially extending through the upper portion and the lower portion, the hollow bore having a preselected inside diameter sized to accept an NMR sample tube smaller than the 5 mm NMR spectrometer sample tube holder and the available sample tube holder.

21. The kit of claim 20 further comprising an overpackage having the at least one adapter therein.

22. The kit of claim 21 further comprising one or more NMR tubes having an outside diameter selected from the group consisting of 3 mm, 4 mm, 4.25 mm and combinations of tubes having diameters of 3 mm, 4 mm and 4.25 mm; and at least one of an adapter sized to accept each of the NMR tubes of the sizes selected therein.

* * * * *